United States Patent [19]

Bialas, Jr. et al.

[11] Patent Number: 4,591,738
[45] Date of Patent: May 27, 1986

[54] CHARGE PUMPING CIRCUIT

[75] Inventors: John S. Bialas, Jr., Manassas; Richard J. Daniels, Dumfries; William J. Mruk, Chantilly, all of Va.

[73] Assignee: International Business Machines Corporation, Armonk, N.Y.

[21] Appl. No.: 546,224

[22] Filed: Oct. 27, 1983

[51] Int. Cl.$^4$ ............................................. H01L 29/78
[52] U.S. Cl. .............................. 307/296 R; 307/246; 307/304; 357/23.6
[58] Field of Search .................. 307/246, 296 R, 297, 307/304, 303; 357/23 C, 52, 51

[56] References Cited

U.S. PATENT DOCUMENTS

| | | | |
|---|---|---|---|
| 4,197,554 | 4/1980 | Meusburger et al. | 357/23 C X |
| 4,211,941 | 7/1980 | Schade, Jr. | 357/23 C X |
| 4,255,756 | 3/1981 | Shimotori et al. | 307/304 X |
| 4,365,316 | 12/1982 | Iwahashi et al. | 307/297 X |
| 4,377,756 | 3/1983 | Yoshihara et al. | 307/296 R |
| 4,384,218 | 5/1983 | Shimotori et al. | 307/297 X |
| 4,414,560 | 11/1983 | Lidow | 357/52 X |
| 4,453,090 | 6/1984 | Sempel | 307/304 X |
| 4,455,493 | 6/1984 | Morton et al. | 307/296 R |
| 4,491,746 | 1/1985 | Koike | 307/296 R |

FOREIGN PATENT DOCUMENTS

| | | |
|---|---|---|
| 2728928 | 6/1977 | Fed. Rep. of Germany . |
| 2336801 | 7/1977 | France . |
| 56-81963 | 4/1981 | Japan ............................ 307/296 R |

OTHER PUBLICATIONS

Japanese Abstracts-Jul. 12, 1980, vol. 4, No. 97, and Sep. 19, 1981, vol. 5, No. 149.

Primary Examiner—Stanley D. Miller
Assistant Examiner—D. R. Hudspeth
Attorney, Agent, or Firm—H. St. Julian; John E. Hoel

[57] ABSTRACT

A substrate voltage generator is disclosed which provides over 1.5 times as much current for a given size circuit, as has been capable with prior art substrate voltage generators. This is achieved by means of a high capacitance per unit area charge pumping capacitor having a triple plate structure and further through the space saving technique of providing a dual use for the source diffusion of the current sinking device in the circuit so as to also serve as the guard ring around the charge pumping circuit of the substrate voltage generator. These and other features of the substrate voltage generator circuit enable relatively large quantities of current to be supplied for maintaining the substrate voltage in large dimension VLSI chips having significant diffusion leakage currents.

4 Claims, 5 Drawing Figures

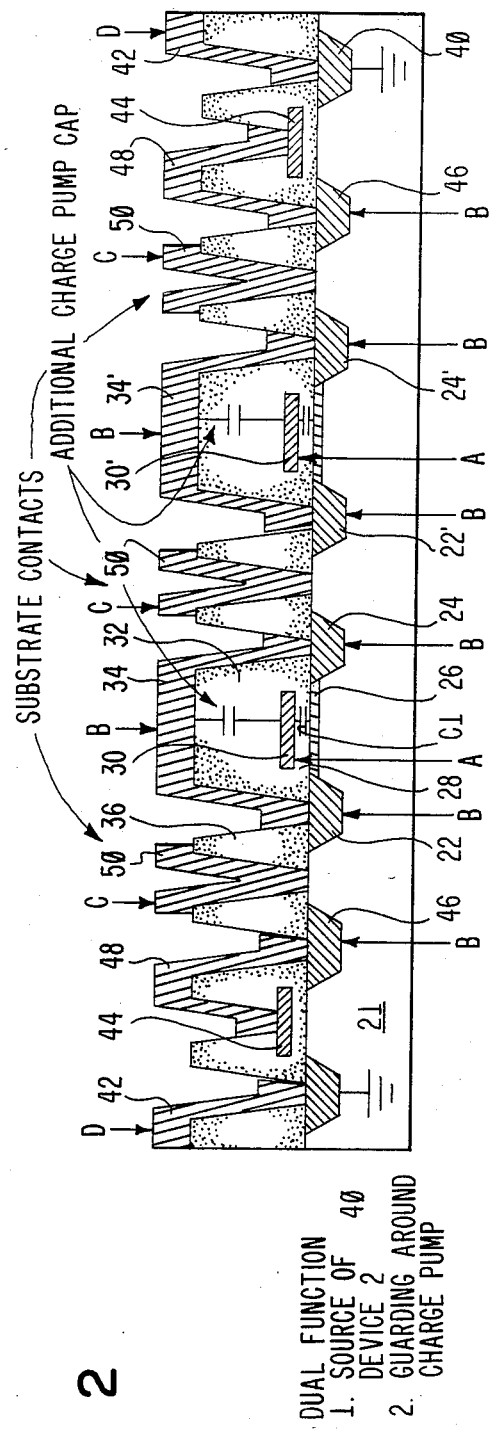
FIG. 2
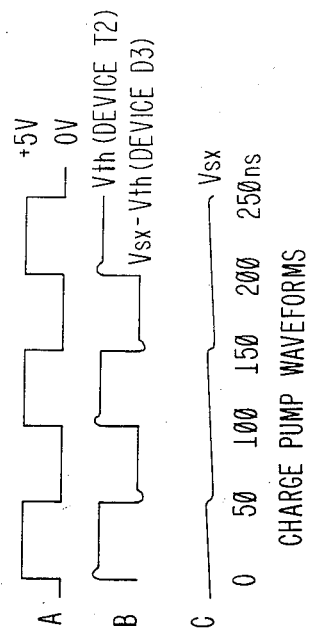
FIG. 5 OPERATION OF CHARGE PUMP
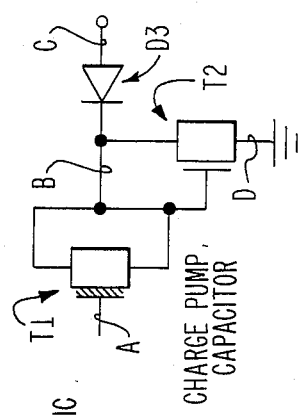
FIG. 1 CHARGE PUMP SCHEMATIC

CHARGE PUMPING CIRCUIT

FIELD OF THE INVENTION

The invention disclosed broadly relates to semiconductor circuits and more particularly relates to improvements in substrate voltage generator circuits for large scale integrated circuit applications.

BACKGROUND OF THE INVENTION

The semiconductor substrate in large scale integrated circuit chips must be maintained at a predetermined voltage relative to the active portions of the circuit, in order to establish a suitable reference for the generation and processing of signals by the integrated circuit. Existing substrate voltage generator circuits typically provide approximately 20 microamperes as a maximum charging current to the substrate. As the device count and density of integrated circuits becomes greater, the amount of diffusion leakage current out of the substrate becomes significant. In order to maintain the desired substrate voltage for very large scale integrated circuits, the size of the substrate voltage generator circuit must be increased, consuming larger quantities of precious real estate on the integrated circuit chip. Typical of such prior art substrate voltage generator circuits include those disclosed in U.S. Pat. Nos. 3,790,812; 3,806,741; and 4,208,595. Although these prior art circuits may have worked well for lower density integrated circuit applications where the diffusion leakage currents are relatively small, they cannot meet the significantly higher substrate charge pumping requirements of modern VLSI integrated circuit chips without increased use of chip real estate.

OBJECTS OF THE INVENTION

It is therefore an object of the invention to provide an improved substrate voltage generator.

It is still another object of the invention to provide an improved substrate voltage generator capable of supplying relatively large quantities of current per unit area occupied by the circuit.

SUMMARY OF THE INVENTION

These and other objects, features and advantages of the invention are accomplished by the improved substrate voltage generator circuit disclosed herein. A substrate voltage generator is disclosed which provides over 1.5 times as much current for a given size circuit, as has been capable with prior art substrate voltage generators. This is achieved by means of a high capacitance per unit area charge pumping capacitor having a triple plate structure and further through the space saving technique of providing a dual use for the source diffusion of the current sinking device in the circuit so as to also serve as the guard ring around the charge pumping circuit of the substrate voltage generator. These and other features of the substrate voltage generator circuit enable relatively large quantities of current to be applied for maintaining the substrate voltage in large dimension VLSI chips having significant diffusion leakage currents.

Additional space saving is achieved for the substrate voltage generator circuit by efficiently harnessing an inherent PN junction diode instead of a more conventional FET charge pumping diode employed in the prior art. An additional feature which provides greater charge pumping capacity per unit area for the substrate voltage generator circuit is the reduction of the parasitic capacitance in series with the charge pumping capacitor in the circuit which is achieved by the elimination of the more conventional FET diode and its associated source diffusion. All of the above features result in a substrate voltage generator circuit which provides the relatively large quantities of current necessary to maintain an appropriate substrate bias in a large dimension VLSI chip having significant diffusion leakage currents, while itself occupying proportionately less space on the chip.

DESCRIPTION OF THE FIGURES

These and other objects, features and advantages of the invention will be more fully appreciated with reference to the accompanying figures.

FIG. 1 is an electrical schematic diagram of the substrate voltage generator circuit.

FIG. 2 is a modified cross-sectional view along the section line 2-2' of FIG. 3, showing the substrate voltage generator circuit, with two device portions for T1 being shown instead of the four device portions depicted in FIG. 3, in order to simplify the description of the invention in FIG. 2.

FIG. 5 is a sequence of three waveforms corresponding to nodes A, B and C of the substrate voltage generator circuit.

DISCUSSION OF THE PREFERRED EMBODIMENT

Figure 3:
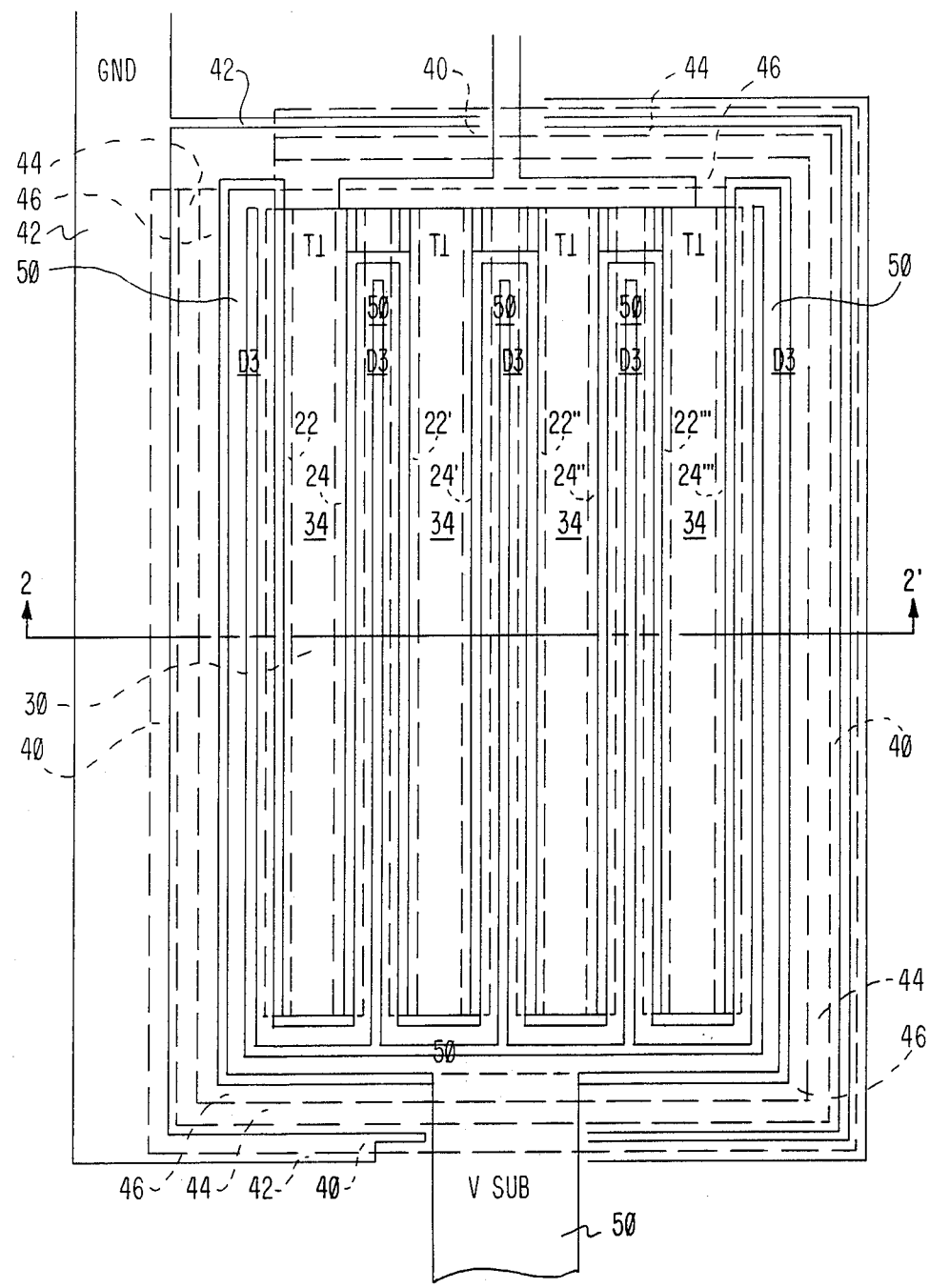
FIG. 3 is a top view of the substrate voltage generator circuit, showing four device portions for T1 arranged within the isolation ring of the circuit.
Figure 4:
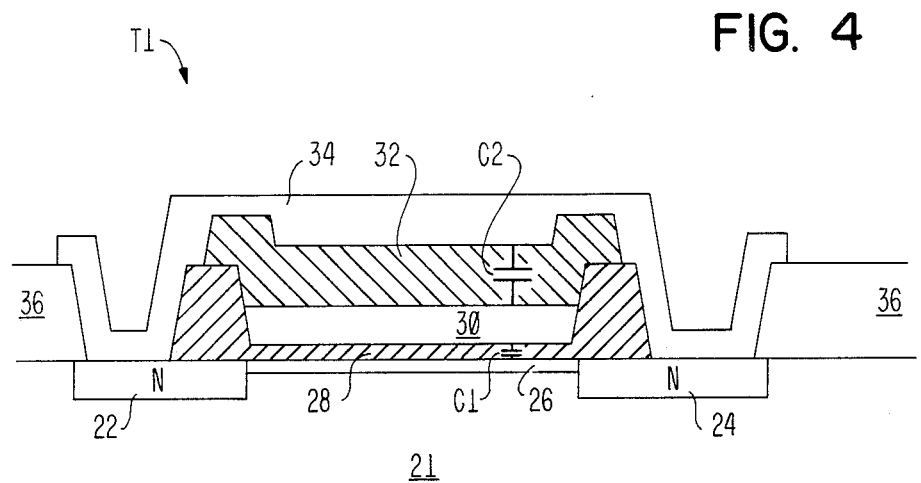
FIG. 4 is a more detailed cross-sectional view similar to that shown in FIG. 2, showing the structure of the device T1.

The substrate voltage generator circuit shown in the electrical schematic diagram of FIG. 1 has an FET capacitor T1 with an input gate node A connected to a periodic waveform which is depicted as the waveform A in FIG. 5. The FET capacitor T1 is shown in greater detail in FIG. 4. The FET capacitor T1 is a triple plate MOS capacitor which has an enhanced capacitance per unit area. The FET capacitor T1 is laid out as is shown in FIG. 3 with a structural arrangement which is shown to better advantage in the cross-sectional diagram of FIG. 2.

The periodic waveform applied to the gate node A of the FET capacitor T1 can be typically a 10 megahertz square wave which drives the substrate voltage generator circuit. The other side of the FET capacitor T1 is designated as node B and is connected to the drain and to the gate of the current sinking FET device T2. The source diffusion of the current sinking FET device T2 is connected to ground potential. The source diffusion 40 of the current sinking FET device T2 has a second function, serving as the isolation ring which surrounds the substrate voltage generator circuit, as is shown in FIG. 3.

The substrate voltage generator circuit of FIG. 1 has the node B also connected to the cathode of a PN junction diode D3 formed by the diffusion to substrate junctions at node B. The anode of D3 is designated as the node C and is the output terminal for the substrate voltage generator circuit, providing a path for negative current to be distributed around the integrated circuit chip so as to provide the desired negative bias voltage for the substrate. The inherent PN diode D3 is efficiently harnessed by placing metal to substrate contacts directly adjacent to all diffusions of node B so as to minimize the resistance in series with the PN junction.

The voltage of node B varies in response to the input waveform at node A, as is shown for the waveform diagram labeled B in FIG. 5. Whenever the potential at the node B drops sufficiently low so as to forward bias the PN junction diode D3, positive current is conducted from the node C to the node B resulting in the negative-going transitions for the substrate voltage $V_{sx}$ shown in the waveform diagram labeled C in FIG. 5.

The FET capacitor T1 is the charge pump capacitor for the circuit. T1 is a depletion mode device whose drain is connected to its source. The inversion layer between its gate and its drain-source form a capacitance C1. The current sinking FET device T2 acts as a diode in that it will only allow current to be conducted from the node B toward the ground potential designated as the node D. (There is also a small parasitic reverse current which flows through the device T2 due to negative threshold effects which occur when the source voltage of the device T2 that is, node B is reduced below the substrate voltage Vsx. This parasitic reverse current is minimized by, again, the efficient harnessing of D3 which reduces the negative voltage swing at node B.) The PN junction diode D3 only allows current to flow out of the substrate node C into the node B. As the input waveform voltage at the node A rises, electrons are drawn through the current sinking FET device T2 from the node D at ground potential to the node B, thereby charging the FET capacitor T1. Later, as the input waveform at the input node A goes low, the electrons in the node B are driven through the diode D3 to the substrate node C, as long as the diode D3 is forward biased. This will then maintain the substrate voltage $V_{sx}$ at the node C at a suitable negative potential with respect to the ground potential at the node D.

Turning now to a more detailed description of the FET capacitor T1, FIG. 2 shows the triple plate MOS capacitor which has an enhanced capacitance per unit area. The P-type silicon substrate 21 has a source diffusion 22 and a drain diffusion 24 of N-type conductivity formed therein. Between the source diffusion 22 and the drain diffusion 24, an N-type ion implant 26 is formed to provide a depletion mode MOSFET device. A gate oxide layer 28 is then deposited over the channel region between the source diffusion 22 and the drain diffusion 24 and a polycrystalline silicon gate electrode 30 lies on top of the gate oxide layer 28. There is a capacitance C1 between the effective parallel plates formed by the polysilicon gate electrode 30 and the N-type implant 26 for the device T1. A silicon dioxide layer 32 is then formed on top of the polycrystalline silicon gate electrode 30 and a metal layer 34 is formed on top of the oxide layer 32, which makes electrical contact with the source diffusion 22 and the drain diffusion 24. The metal layer 34 has a capacitance C2 with the polycrystalline silicon gate electrode 30 through the oxide layer 32. By virtue of the electrical connection between the layer 34 and the source diffusion 22 and drain diffusion 24, the metal layer 34 and the N-type implant 26 are electrically connected in common and serve as the outer pair of plates of the triple plate capacitor, the third internal plate being formed by the polycrystalline silicon gate electrode 30. In this manner, the capacitance per unit area of the device T1 is the sum of the capacitance per unit area C1 and the capacitance per unit area C2 for the triple plate capacitor.

The importance of increasing the capacitance per unit area of the charge pump capacitor T1 is that the quantity of charge which can be drawn from the grounded node D through the device T2 into the node B for every voltage swing of the input waveform at the node A, is proportional to the capacitance of the charge pumping capacitor T1. By increasing the capacitance per unit area for the triple plate capacitor T1, the quantity of charge which can be pumped for a given amplitude of the input waveform at the node A is significantly increased. The charge which is drawn through the device T2 into the node B is then driven through the diode D3 to the substrate node C as was described above. In this manner, the charge pumping capacity of the substrate voltage generator per unit area occupied by the circuit on an integrated circuit chip, is significantly increased over the charge pumping capacity per unit area of prior art substrate voltage generator circuits. Typical FET manufacturing processes will yield a triple plate capacitor structure for T1 which has at least approximately 10 percent more capacitance per unit area than that of a more conventional two-plate capacitor.

In order for the on chip logic circuitry to properly operate near the substrate voltage generator, it is important not to allow excess negative charges to accumulate in the substrate in the vicinity of the substrate voltage generator. This is typically prevented by providing an isolation ring around the substrate voltage generator circuit. Isolation rings in the prior art have typically been ring-like enclosures of a PN junction which is reverse biased. In either case in the prior art, the isolation ring occupies a significant proportion of the overall area occupied by the substrate voltage generator circuit, thereby reducing the current capacity per unit area of the prior art circuits.

This problem has been overcome by the substrate voltage generator circuit disclosed herein, by the dual use of the source diffusion 40 for the current sinking FET device T2 so as to also serve as the PN junction isolation ring for the substrate voltage generator circuit. This can be seen more clearly with reference to FIG. 3, wherein the FET device T2 is shown almost entirely enclosing the substrate voltage generator circuit. The FET device T2 is formed by the N-type diffusion 40 which almost entirely encompasses the periphery of the substrate voltage generator circuit of FIG. 3. The cross-sectional view shown in FIG. 2 illustrates the relative placement of the diffusion 40. The drain diffusion 46 for the current sinking FET device T2 is formed by means of the diffusion 46 which extends around the edge of the substrate voltage generator circuit in a geometrically parallel manner with the diffusion 40, as is shown in FIG. 3. A polycrystalline silicon gate electrode 44 is separated by a gate insulator layer from the channel region in the P-type semiconductor substrate lying between the source diffusion 40 and drain diffusion 46 of the current sinking FET device T2. Since most substrate voltage generators require a current sinking FET device having a source terminal for serving as a source of electrons for the charge pumping circuit, the area occupied by the source diffusion 40 would also have to be occupied by most prior art substrate voltage generator circuits. However, in accordance with the invention, by combining the function of serving as the isolation PN junction ring for the substrate voltage generator circuit, the overall area occupied by the entire circuit of FIG. 3 is significantly reduced over that which has been required in the prior art for substrate voltage generator circuits. A typical reduction in the area occupied by the circuit invention is at least approximately 25 percent for a given charge pumping capability.

As is seen from FIGS. 2 and 3, several FET capacitor device portions can be provided for T1 within the area defined by the isolation ring 40 for the circuit. A first FET device portion for T1 can be formed by the metal electrode 34, the source diffusion 22 and the drain diffusion 24, as described above. A second FET capacitor device portion for T1 can be formed by the metal electrode 34', the source diffusion 22', and the drain diffusion 24'. A third FET capacitor device portion for T1 can be formed by the source diffusion 22", the drain diffusion 24", and the metal layer 34". A fourth FET capacitor device portion for T1 can be formed by the source diffusion 22''', the drain diffusion 24''', and the metal layer 34'''. The source and drain diffusions for each of these FET capacitor device portions for T1 are connected in common through the substrate 21, as can be seen in FIG. 2. The four metal electrodes 34, 34', 34" and 34''' are electrically connected in common. Similarly, the polycrystalline silicon gates 30, 30', 30" and 30''' for the four component FET capacitor portions for T1 are connected in common. In this manner, the capacitance of the FET capacitor T1 is the sum of the four parallel component capacitances shown in FIG. 3, thereby quadrupling the capacitance for the FET capacitor T1 in the electrical schematic diagram of FIG. 1.

The resultant substrate generator circuit is typically capable of generating more than 150 microamperes of charging current in an area of 0.045 square millimeters of the integrated circuit chip. This amount of charging current is sufficient to supply the substrate voltage for an eight millimeter-by-eight millimeter VLSI chip with over 36,000 equivalent gates.

The preferred embodiment disclosed for the circut invention uses N channel FET devices formed in a P-type substrate to negatively charge the substrate. An alternate embodiment can be made for P channel FET applications by reversing the polarity of the current sinking transistor T2 and the polarity of the diode D3 so as to positively charge an N-type substrate.

Although a specific embodiment of the invention has been disclosed, it will be understood by those with skill in the art that the foregoing and other changes in form and details may be made therein without departing from the spirit and the scope of the invention.

We claim:

1. A charge pumping circuit for a substrate voltage generator on a VLSI chip, comprising:
   a triple-plate FET capacitor having diffused source and drain regions connected to a first node forming a channel region therebetween, with an implant positioned between said diffused source and drain regions and a first gate electrode juxtaposed over said channel region and connected to a periodic input signal source, and including a second gate electrode juxtaposed over said first gate electrode and electrically connected to said first node, for coupling said periodic signals to said first node;
   a PN junction diode having its anode connected to said substrate and its cathode connected to said first node, for providing a charging path from said first node to said substrate;
   a current sinking FET device having its drain and gate connected to said first node and its source diffusion connected to ground potential, the source diffusion thereof being shaped as a substantially closed polygon enveloping said triple-plate FET capacitor, said PN junction diode and said current sinking FET device and serving as a guard ring for the circuit;
   whereby positive charge is pumped from said substrate through said diode to said first node in response to said periodic input signals coupled through said triple-plate FET capacitor to said said first node, said pumped charge then passing through said current sinking device to ground potential, thereby providing a desired substrate voltage to said substrate.

2. The circuit of claim 1, wherein said cathode of said diode and said drain of said FET device are formed from a single-N-type diffusion in said substrate.

3. A charge pumping circuit for a substrate voltage generator on a VLSI chip, comprising:
   a triple-plate FET capacitor having diffused source and drain regions connected to a first node forming a channel region therebetween, with an implant positioned between said diffused source and drain regions and a first gate electrode juxtaposed over said channel region and connected to a periodic input signal source, and including a second gate electrode juxtaposed over said first gate electrode and electrically connected to said first node, for coupling said periodic signals to said first node;
   diode having its cathode connected to said substrate and its anode connected to said first node, for providing a charging path from said first node to said substrate;
   a current sinking FET device having its drain and gate connected to ground potential and its source diffusion connected to said first node, the drain diffusion thereof being shaped as a substantially closed polygon enveloping said triple-plate FET capacitor, said PN junction diode and said current sinking FET device and serving as a guard ring for the circuit;
   whereby positive charge is pumped from said substrate through said diode to said first node in response to said periodic input signals coupled through said triple-plate FET capacitor to said first node, said pumped charge then passing through said current sinking device to ground potential, thereby providing a desired substrate voltage to said substrate.

4. A charge pump circuit for a substrate voltage generator on a VLSI chip, comprising:
   a triple-plate FET capacitor having diffused source and drain regions connected to a first node forming a channel region therebetween, with an implant positioned between said source and drain regions and a first gate electrode juxtaposed over said channel region and connected to a periodic input signal source, and including a second gate electrode juxtaposed over said first gate and electrically connected to said first node, for coupling said periodic signals to said first node;
   a unidirectional current conducting element connected between said substrate and said first node, for providing a charging path from said first node to said substrate;
   a current sinking FET device having its drain and gate connected to said first node and its source diffusion connected to a reference potential, the source diffusion thereof being shaped as a substantially closed polygon enveloping and triple-plate capacitor, said unidirectional current conducting element and said current sinking FET device and serving as a guard ring for the circuit;

whereby charge is pumped from said substrate through said current conducting element to said first node in response to said periodic input signals coupled through said triple-plate capacitor to said first node, said pumped charge then passing through said current sinking device to said reference potential, thereby providing a desired substrate voltage to said substrate.

* * * * *